(12) United States Patent
Rhelimi

(10) Patent No.: US 7,789,312 B2
(45) Date of Patent: Sep. 7, 2010

(54) MULTI-CHIP CARD

(75) Inventor: Alain Rhelimi, Montrouge (FR)

(73) Assignee: Gemalto SA, Meudon Cedex (FR)

( * ) Notice: Subject to any disclaimer, the term of this patent is extended or adjusted under 35 U.S.C. 154(b) by 820 days.

(21) Appl. No.: 10/545,535

(22) PCT Filed: Feb. 16, 2004

(86) PCT No.: PCT/IB2004/000384

§ 371 (c)(1), (2), (4) Date: Aug. 12, 2005

(87) PCT Pub. No.: WO2004/072980

PCT Pub. Date: Aug. 26, 2004

(65) Prior Publication Data

US 2006/0056216 A1      Mar. 16, 2006

(30) Foreign Application Priority Data

Feb. 14, 2003    (EP)    ................... 03290365

(51) Int. Cl.
G06K 19/06    (2006.01)

(52) U.S. Cl. ................... 235/492; 235/438; 235/441; 365/51

(58) Field of Classification Search ................. 235/492, 235/438, 441; 365/51
See application file for complete search history.

(56) References Cited

U.S. PATENT DOCUMENTS

| 4,471,232 | A | * | 9/1984 | Peddie et al. | ................. 307/35 |
| 5,265,161 | A | * | 11/1993 | Rodriguez | ................. 380/229 |
| 5,490,117 | A | | 2/1996 | Oda et al. | |
| 5,818,781 | A | | 10/1998 | Estakhri et al. | |
| 5,844,853 | A | | 12/1998 | Nakamura et al. | |
| 6,168,083 | B1 | * | 1/2001 | Berger et al. | ................. 235/492 |
| 6,199,128 | B1 | * | 3/2001 | Sarat | ................. 710/301 |
| 2002/0066793 | A1 | * | 6/2002 | Hayashi | ................. 235/492 |
| 2003/0141590 | A1 | * | 7/2003 | Kamiya et al. | ................. 257/730 |
| 2004/0061147 | A1 | | 4/2004 | Fujita et al. | |
| 2007/0102530 | A1 | * | 5/2007 | Nishizawa et al. | ................. 235/492 |

FOREIGN PATENT DOCUMENTS

EP    0316549  A2    5/1989

\* cited by examiner

*Primary Examiner*—Allyson N Trail
(74) *Attorney, Agent, or Firm*—Osha • Liang LLP

(57) ABSTRACT

A portable object (1) of the smart card type comprises a main circuit (3, 8, 9, 10) for internal processing and storage of data. The main circuit comprises several integrated circuits (3, 10). The portable object comprises a supply voltage circuit (7) for applying a first supply voltage (3 to 5V) to one of the integrated circuits (3) of the main circuit and for applying a second, different supply voltage (1.2 to 1.8 V) to another integrated circuit (10) of the main circuit.

23 Claims, 1 Drawing Sheet

MULTI-CHIP CARD

FIELD OF THE INVENTION

The invention relates to Intelligent portable objects commonly known as smart cards or Integrated circuit (IC) cards.

BACKGROUND OF THE INVENTION

A smart card generally comprises a single Integrated circuit, which is either a memory or a micro-controller. A smart card whose integrated circuit is a memory is commonly referred to as memory card. A smart card whose integrated circuit is a micro-controller is commonly referred to as microprocessor card.

A micro-controller typically comprises the following elements:
- a central processing unit (CPU);
- a volatile memory (RAM);
- one of more non-volatile memories (ROM, EEPROM or Flash memory);
- a communication interface for communication with a card excepting device, such as, for example, a mobile phone.

The standards ISO 7816 and GSM11.11 relate to smart cards of the format ID-0 and ID-000, respectively.

The international patent application published under number WO200208487 describes a smart card comprising various integrated circuits. A communication bus couples the various integrated circuits which each other. The integrated circuits receive a supply voltage from a single power supply bus. There is thus a single supply voltage that is applied to each integrated circuit.

U.S. Pat. No. 5,490,117 discloses an IC card that comprises an integrated circuit that has an operating voltage of 3.3 V. The IC card can be used in a modem host system rated at 3.3 V or in a conventional host system rated at 5 V. The integrated circuit card comprises an analog switch, an external interface circuit, an internal interface circuits, and a high voltage detection circuit. If the voltage of the host system is less than or equal to an upper limit voltage of 4 V, the power supply voltage is applied unchanged through the analog switch to a ROM. On the other hand, if the power supply voltage is greater than this upper limit voltage of 4 V, the analog switch is made nonconductive and thus the power supply voltage is not applied to the ROM. This prevents the ROM from being destroyed. If a regulated-voltage circuit is also provided, a power supply voltage regulated at 3.3 V can be applied to the ROM, even when the power supply voltage of the host system is greater than the upper limit voltage of 4 V.

SUMMARY OF THE INVENTION

In accordance with an aspect of the invention, a portable object of the smart card type comprises a main circuit for internal processing and storage of data. The main circuit comprises several integrated circuits. The portable object comprises a supply voltage circuit for applying a first supply voltage to one of the integrated circuits of the main circuit and for applying a second, different supply voltage to another integrated circuit of the main circuit.

The invention takes the following aspects into consideration. The preferred power supply voltage of an integrated circuit generally depends on the technology that has been used to fabricate the integrated circuit integrated circuit fabrication technology is generally characterized in terms of gate width. The use of a single power supply voltage within a smart card that comprises various integrated circuits, necessitates that the integrated circuits are fabricated in accordance with the same technology, for example, a technology of 0.35 μm, 0.35 μm being the gate width. For example, let it be assumed that a smart card comprises two integrated circuits: a micro-controller and a flash memory. Let it be assumed that the micro-controller has been fabricated with 0.35 μm technology. In that case, the flash memory should also be preferably have been fabricated with 0.35 μm technology. The inverse also applies. Let it be assumed that a smart card designer seeks to partition various functions on different integrated circuits within a single smart card in accordance with the prior art. In that case, the designer will use integrated circuits that have been fabricated in accordance with similar or identical technologies.

Integrated circuits that constitute memories can generally be fabricated with a relatively narrow gate width. A relatively narrow gate width implies a relatively low supply voltage. In contradistinction, micro-controllers for smart cards require a relatively wide gate width. A relatively wide gate width generally implies a relatively high power supply voltage. For example, in the year 2003, flash memories having a storage capacity of 64 MB or more were fabricated using a 0.13 μm gate width technology. Those flash memories typically operate with a power supply voltage of 1.8 V. In contradistinction, in the year 2003, micro-controllers for smart cards were typically fabricated using a 0.35 μm technology. Those microcontrollers require a power supply voltage of 3 V.

A smart card in accordance with the invention comprises several integrated circuits for internal processing and storage of data. The smart card comprises a supply voltage circuit for applying a first supply voltage to one of these integrated circuits and for applying a second, different supply voltage to another of these integrated circuits.

Accordingly, the invention allows use of integrated circuits fabricated in accordance with different technologies in a single smart card. The costs associated with the supply voltage circuit are generally outweighed by the gain associated with the possibility to use integrated circuits fabricated in accordance with different technologies. The invention allows, for example, a smart card with a memory having a relatively great capacity for a given price of the smart card. Consequently, the invention allows greater functionality for a given price.

These and other aspects of the invention will be described hereinafter in the detailed description with reference to the drawings.

DETAILED DESCRIPTION

Figure 1:
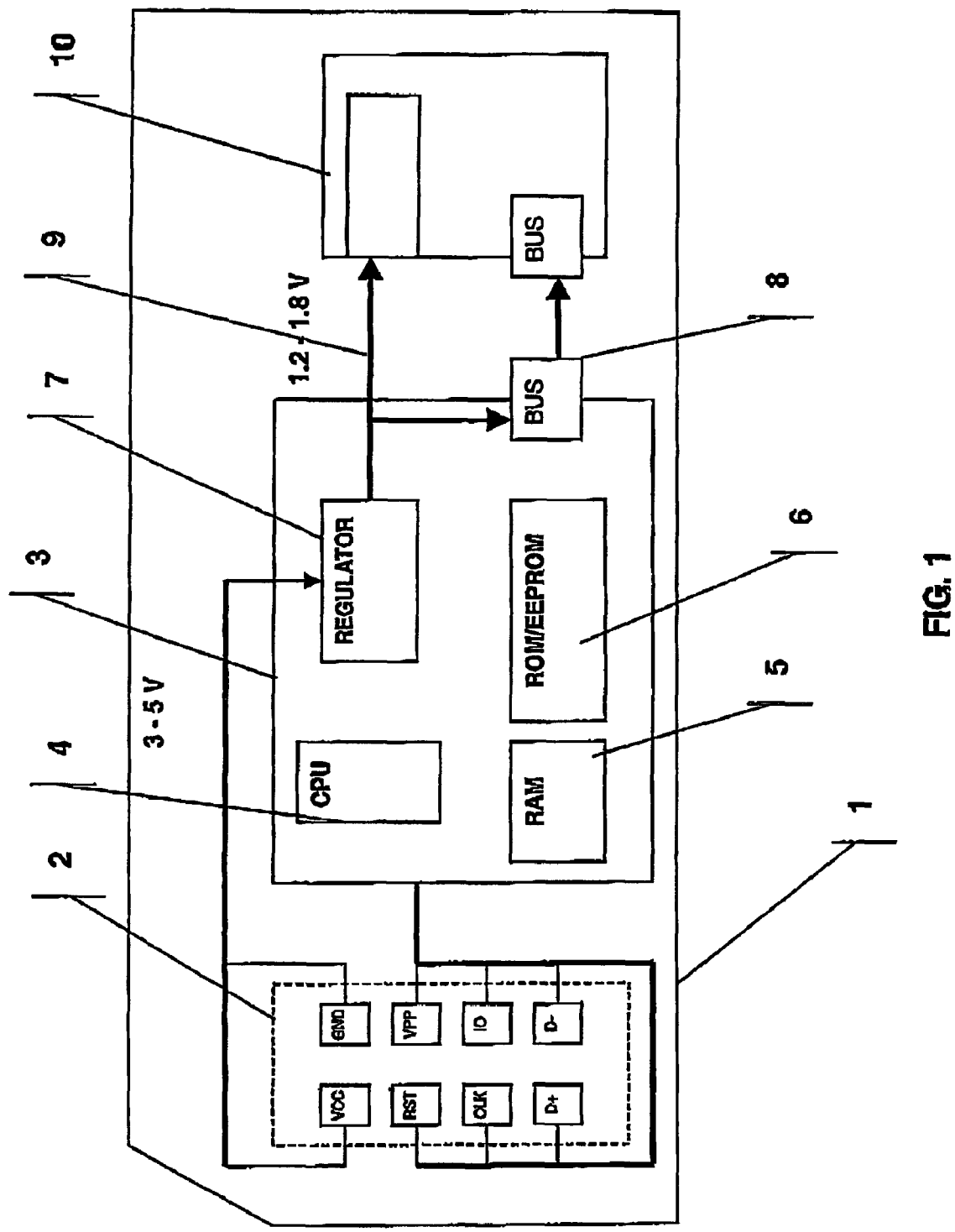
FIG. 1 is a diagram illustrating an example of a smart card in accordance with the invention.

FIG. 1 illustrates a smart card 1 in the format ID 000 of the GSM 11.11 standard. The smart card comprises a set of contacts 2 and two different integrated circuits: a micro-controller 8 and an additional memory 10, which may be, for example, of the Flash type. The smart card 1 further comprises an internal communication bus 8 and an internal power-supply path 9. The communication bus comprises an interface within the micro-controller 3 and another interface within the additional memory 10. The micro-controller 3 comprises central processing unit (CPU) 4, a volatile memory 5 of the RAM type, a non-volatile memory 6 of the type EEPROM, ROM or FLASH. The micro-controller 3 further comprises a voltage regulator 7. The voltage regulator 7 is programmable.

The micro-controller 3 receives a power supply voltage from outside the smart card via a contact VCC within the set of contacts 2. This power supply voltage originates, for example, from a mobile telephone in which the smart card 1 has been inserted. The power supply voltage applied at the contact VCC, which is applied to the micro-controller 3, is typically within the range between 3 and 5 V. This voltage will be referred to as primary supply voltage hereinafter. The voltage regulator 7 receives the primary supply voltage and generates on the basis thereof a secondary supply voltage. The secondary supply voltage is preferably within a range comprised between 1.2 and 1.8 V. The additional memory 10 receives the secondary supply voltage via the internal power-supply path 9. The internal communication bus 8, which couples the additional memory 10 to micro-controller 3, also receives the secondary supply voltage. In more detail, the interface of the internal communication bus 8 that is within the micro-controller 3, receives the secondary supply voltage. Accordingly, the signals transmitted via the communication bus 8 have voltage levels that are compatible with the additional memory 10.

The voltage regulator 7 can interrupt the power supply of the additional memory 10 when the additional memory 10 is not used. This may be the case, for example, when the additional memory 10 is in a sleep mode. The interruption of the power supply allows a reduction of electrical power consumption of the smart card. The voltage regulator 7 is controllable. For example, the secondary supply voltage may depend on a command value present in the micro-controller 3. This command value may have been programmed into volatile memory RAM or into the non-volatile memory ROM/EEPROM during a personalization phase of the smart card 1. Accordingly, the additional memory 10 may be fabricated in accordance with any one of a great variety of different technologies. The secondary supply voltage is controlled to have a value that is compatible with the particular type of additional memory 10 that is used. Thus, the micro-controller 3 can be combined, within a single smart card, with a great variety of different types of additional memories or other types of integrated circuits.

It should be noted that the additional memory 10 does not have any direct connection to the exterior of the smart card 1. All connections with the exterior are made via the micro-controller 3. Accordingly, the additional memory 10 does not require special features that protect the additional memory 10 against an electrostatic discharge.

The description herein before illustrates the following characteristics. A portable object (1) of the smart card type comprises a main circuit (3, 8, 9, 10) for internal processing and storage of data. The main circuit comprises several integrated circuits (3, 10). The portable object comprises a supply voltage circuit (7) for applying a first supply voltage (3 to 5 V) to one of the integrated circuits (3) of the main circuit and for applying a second, different supply voltage (1.2 to 1.8 V) to another integrated circuit (10) of the main circuit.

The description hereinbefore with reference to FIG. 1 illustrates the invention rather than limits the invention. It is evident numerous alternatives exist that are within the scope of the appended claims. The smart card 1 illustrated in FIG. 1 is just an example. In another embodiment, a smart card in accordance with the invention may comprise an integrated circuit that constitutes a coprocessor. The coprocessor may be arranged, for example, to effect cryptographic calculations. It is evident that the smart card in accordance with the invention may comprise three or more integrated circuits. For example, a smart card in accordance with the invention may comprise a micro-controller one or more additional memories and one or more coprocessors.

There are numerous manners for supplying, within a smart card, a first supply voltage to an integrated circuit and second power supply voltage to another integrated circuit. For example, a smart card may comprise a power supply circuit that receives a supply voltage from the exterior via a contact VOC and which, in response, generates various internal supply voltages. One of these internal supply voltages may be applied to, for example, a micro-controller and another internal supply voltage may be applied to, for example, a memory. In such an implementation the supply voltage received from the exterior is not directly applied to the micro-controller, contrary to the embodiment shown in FIG. 1.

A smart card in accordance with the invention may comprise an integrated circuit that necessitates different supply power voltages. For example, an integrated circuit may comprise a core circuit and an interface circuit, such as an IO buffer. These two circuits may necessitate different power supply voltages. In such an implementation the smart card may comprise a voltage regulator that furnishes different supply voltages via a supply voltage bus similar to the internal power-supply path 9 in the smart card shown in FIG. 1.

With regard to the appended claims it should be noted that the word comprising does not exclude the presence of other elements or stamps listed in a claim. The word a preceding an element or any step does not exclude the presence of several of these elements or steps.

The invention claimed is:

1. A portable object of the smart card type comprising a main circuit for internal processing and storage of data, wherein the main circuit comprises a plurality of integrated circuits and wherein the portable object comprises a unique supply voltage circuit for applying a first supply voltage to one of the integrated circuits of the main circuit and wherein the supply voltage circuit is able to apply a second, different supply voltage to another integrated circuit of the main circuit.

2. The portable object of claim 1, wherein the supply voltage circuit comprises a voltage modifier arranged to receive the first supply voltage and to generate the second supply voltage on the basis of the first supply voltage.

3. The portable object of claim 2, wherein the voltage modifier is controllable so as to control the second supply voltage.

4. The portable object of claim 2, wherein the voltage modifier is arranged to interrupt the second supply voltage.

5. The portable object of claim 4, wherein the micro-controller is arranged to interrupt the second supply voltage.

6. The portable object of claim 4, further comprising:
   an additional memory coupled to a micro-controller via an internal power-supply path arranged to apply the second supply voltage to the additional memory,
   wherein the voltage modifier interrupts the power supply to the additional memory when the additional memory is not used.

7. The portable object of claim 6, wherein the voltage modifier interrupts the power supply to the additional memory when the additional memory is in a sleep mode.

8. The portable object of claim 2, wherein the voltage modifier is comprised within one of said integrated circuits.

9. The portable object of claim 8, wherein the integrated circuit in which the voltage modifier is comprised, constitutes a micro-controller.

10. The portable object as claimed in claim 9, wherein the micro-controller is arranged to control the second supply voltage.

11. The portable object of claim 9, wherein one of said integrated circuits constitutes a memory that is coupled to the micro-controller via an internal power-supply path arranged to apply the second supply voltage to the memory.

12. The portable object of claim 11, wherein the micro-controller comprises an interface for communicating with the memory and an integrated power-supply path for supplying a second supply voltage to the interface.

13. A portable object of the smart card type comprising a main circuit for internal processing and storage of data, wherein the main circuit comprises a plurality of integrated circuits, wherein the portable object comprises a supply voltage circuit for applying a first supply voltage to one of the integrated circuits of the main circuit, wherein the supply voltage circuit is able to apply a second, different supply voltage to another integrated circuit of the main circuit, and wherein the supply voltage circuit comprises a voltage modifier arranged to receive the first supply voltage and to generate the second supply voltage on the basis of the first supply voltage.

14. The portable object of claim 13, wherein the voltage modifier is controllable so as to control the second supply voltage.

15. The portable object of claim 13, wherein the voltage modifier is arranged to interrupt the second supply voltage.

16. The portable object of claim 15, further comprising:
an additional memory coupled to a micro-controller via an internal power-supply path arranged to apply the second supply voltage to the additional memory, wherein the voltage modifier interrupts the power supply to the additional memory when the additional memory is not used.

17. The portable object of claim 13, wherein the voltage modifier is comprised within one of said integrated circuits.

18. The portable object of claim 17, wherein the integrated circuit in which the voltage modifier is comprised, constitutes a micro-controller.

19. The portable object as claimed in claim 18, wherein the micro-controller is arranged to control the second supply voltage.

20. The portable object of claim 18, wherein one of said integrated circuits constitutes a memory that is coupled to the micro-controller via an internal power-supply path arranged to apply the second supply voltage to the memory.

21. A portable object of the smart card type comprising:
a main circuit for internal processing and storage of data, wherein the main circuit comprises a plurality of integrated circuits; and
a supply voltage circuit for applying a first supply voltage to a first one of the integrated circuits of the main circuit, wherein the supply voltage circuit is able to apply a second, different supply voltage to a second one of the integrated circuits of the main circuit,
wherein the first and second integrated circuits are on different integrated circuit chips.

22. A portable object comprising:
a main circuit for internal processing and storage of data, wherein the main circuit comprises a smart card chip type and at least one other integrated circuit; and
a unique supply voltage circuit for applying a first supply voltage to the smart card chip type and wherein the supply voltage circuit is able to apply a second, different supply voltage to the at least one other integrated circuit of the main circuit.

23. A portable object of a smart card type comprising:
a main circuit for internal processing and storage of data, wherein the main circuit comprises a plurality of integrated circuits;
a supply voltage circuit for applying a first supply voltage to a first one of the plurality of integrated circuits and for applying a second different supply voltage to a second one of the plurality of integrated circuits,
wherein the supply voltage circuit is able to supply a range of voltage levels in order to be compatible to different types of integrated circuits, and
wherein the level of the second supply voltage being controlled by a program.

* * * * *